United States Patent
Hirano et al.

[11] Patent Number: 5,179,298
[45] Date of Patent: Jan. 12, 1993

[54] CMOS BUFFER CIRCUIT WHICH IS NOT INFLUENCED BY BOUNCE NOISE

[75] Inventors: Hiroshige Hirano, Nara; Tatsumi Sumi, Osaka, both of Japan

[73] Assignee: Matsushita Electric Industrial Co., Ltd., Osaka, Japan

[21] Appl. No.: 641,882

[22] Filed: Jan. 16, 1991

[30] Foreign Application Priority Data

Jan. 17, 1990 [JP] Japan ................... 2-7435

[51] Int. Cl.$^5$ .................................. H03K 17/16
[52] U.S. Cl. ........................... 307/443; 307/451; 307/263
[58] Field of Search ............... 307/443, 448, 451, 542, 307/544, 546, 548, 554, 246, 270, 296.8, 263

[56] References Cited

U.S. PATENT DOCUMENTS

| | | | |
|---|---|---|---|
| 4,209,713 | 6/1980 | Satou et al. | 307/451 X |
| 4,740,717 | 4/1988 | Fletcher et al. | 307/443 |
| 4,758,743 | 7/1988 | Dehganpour et al. | 307/443 |
| 4,785,201 | 11/1988 | Martinez | 307/443 |
| 4,789,796 | 12/1988 | Foss | 307/443 |
| 4,800,298 | 1/1989 | Yu et al. | 307/443 |
| 4,918,332 | 4/1990 | Nix | 307/451 X |
| 4,918,339 | 4/1990 | Shigeo et al. | 307/443 X |
| 4,959,561 | 9/1990 | McDermott et al. | 307/451 X |
| 4,982,120 | 1/1991 | Longwell et al. | 307/443 X |
| 5,021,684 | 6/1991 | Ahuja et al. | 307/263 X |
| 5,021,685 | 6/1991 | Kihara | 307/451 X |

*Primary Examiner*—David Hudspeth
*Attorney, Agent, or Firm*—Ratner and Prestia

[57] ABSTRACT

This invention relates to an input buffer circuit including a NOT circuit composed of N-channel MOS transistor (NMOST) and P-channel MOS transistor (PMOST). This adjusts the resistance value between the NMOST and grounding voltage VSS, or the resistance value between the PMOST and supply voltage VCC, or both resistance values so as to decrease the current flowing the supply voltage VCC to the grounding voltage VSS. According to the construction, the power consumption is suppressed, and floating of grounding voltage VSS and lowering of supply voltage VCC may be prevented, so that the switching level of the input signal will not be deviated from the target value.

20 Claims, 6 Drawing Sheets

CMOS BUFFER CIRCUIT WHICH IS NOT INFLUENCED BY BOUNCE NOISE

BACKGROUND OF THE INVENTION

1. Field of the Invention

The present invention relates to an input buffer circuit capable of supplying stable input signals.

2. Description of the Prior Art

Recently, as semiconductor integrated circuit devices are becoming increasingly miniaturized, the input buffer circuit has come to be an important circuit part of such integrated circuit devices. This is because the input buffer circuit determines characteristics, such as the switching level of the input signals supplied from outside sources.

Conventional input buffer circuits are shown in FIGS. 5A, 5B, 6A and 6B. In these figures, symbol A denotes an input signal supplied from an outside source, and B is an output signal obtained from the input buffer circuit. QP1, QP2, QP3, QP4 are P-channel type MOS transistors (hereinafter called PMOSTs), and QN1, QN2, QN3, QN4 are N-channel type MOS transistors (NMOSTs). R11, R12, R13, R14 are parasitic resistances induced by wiring. VCC is the supply voltage, and VSS is the grounding voltage. FIGS. 5A, 5B, 6A and 6B show an input buffer circuit in which four NOT circuits composed of complementary MOS transistors are cascade-connected.

In FIG. 5A, the input buffer circuit is formed on a semiconductor substrate and disposed near the pad to which the supply voltage VCC is applied. Therefore, parasitic resistance barely exists in the wiring connected between the supply voltage VCC and PMOSTs QP1–QP4. On the other hand, in the wiring connected between the grounding voltage VSS and NMOSTs QN1–QN4 there is a parasitic resistance R11.

In FIG. 5B, the input buffer circuit is formed on a semiconductor substrate and disposed near the pad to which the grounding voltage VSS is applied. Since the wiring is short, there is no parasitic resistance between the grounding voltage VSS and NMOSTs QN1–QN4. Between the supply voltage VCC and PMOSTs QP1–QP4, there is a parasitic resistance R12 induced by the wiring.

In FIG. 6A, the input buffer circuit is formed on a semiconductor substrate and disposed near the pad to which the supply voltage VCC is applied. Since the wiring is short, there is no parasitic resistance between the grounding voltage VCC and PMOSTs QP1–QP4. Between the grounding voltage VSS and NMOSTs QN2–QN4, there is a parasitic resistance R13 which is induced by the wiring. Furthermore, the source electrode of NMOST QN1 of the first stage is connected to the grounding voltage VSS through the wiring other than the wiring possessing the parasitic resistance R13. Accordingly, between the NMOST QN1 and grounding voltage VSS, there is parasitic resistance R1.

In FIG. 6B, the input buffer circuit is formed on a semiconductor substrate and disposed near the pad to which the supply voltage VCC is applied. Since the wiring is short, there is no parasitic resistance between the grounding voltage VSS and NMOSTs QN1–QN4. Between the supply voltage VCC and PMOSTs QP2–QP4, there is a parasitic resistance R14 induced by the wiring. The source electrode of PMOST QP1 of the first stage is connected to the supply voltage VCC through the wiring other than the wiring possessing the parasitic resistance R14. Accordingly, there is a parasitic resistance R12 between the PMOST QP1 and the supply voltage VCC.

Meanwhile, in FIG. 6A and FIG. 6B, the complementary MOS transistors of the first stage are connected to the supply voltage VCC and ground voltage VSS through separate wiring respectively in order to decrease the current flowing through the parasitic resistance caused in the circuit after the second stage.

In such prior art, however, the input buffer circuit is constructed by connecting a plurality of NOT circuits composed only of complementary MOS transistors. Accordingly, if the logic voltage of the input signal is an intermediate level between HIGH (or "H") level and LOW (or "L") level, when an input signal A is fed, both the PMOST and NMOST are set in a conductive state at the same time. As a result, a very large current flows from the supply voltage VCC to the grounding voltage VSS. Hence, the power consumption increases. Furthermore, between the grounding voltage VSS and NMOST, there is a parasitic resistance R11 due to the wiring, and the voltage drops due to the current flowing through the parasitic resistance R11. Due to this voltage drop, the switching level of the input signal A deviates from the target value, possibly resulting in malfunction.

This problem is further described below.

The current flowing in the saturated region of an N-channel MOS transistor (IN) is $$IN = \gamma N (VG - VSN - VTN)^2$$

where VG is gate voltage, VSN is source voltage, VTN is switching voltage (positive value), and $\gamma N$ is a constant.

By contrast, the current flowing in the saturated region of P-channel MOS transistor (IP) is $$IP = \gamma P (VSP - VG - VTP)^2$$

where VPS is source voltage VTP is switching voltage (negative value), and $\gamma P$ is a constant.

The switching voltage VTH of the NOT circuit is the gate voltage to achieve the relation of IN=IP, and hence it follows that $\gamma N(VG - VSN - VTN)^2 = \gamma P(VSP - VG - VTP)^2$. Hence, $$VTH = (VSP + \alpha VSN + \alpha VTN + VTP)/(\alpha + 1) \quad (1)$$

where constant $\alpha$ is defined as $\alpha = (\gamma N / \gamma P)^{(\frac{1}{2})}$.

In circuit design, in the ideal state free from parasitic resistance, the relations $$VNS = VSS, \; VSP = VCC$$

are established, and therefore equation (1) is rewritten as follows at the switching voltage $VTH_0$ in the ideal state:

$$VTH_0 = (VCC + \alpha VSS + \alpha VTN + VTP)/(\alpha + 1) \quad (2)$$

It is known from equation (2) that the switching voltage $VTH_0$ in the ideal state is determined by the supply voltage VCC, grounding voltage VSS, switching voltage of NMOST, switching voltage of PMOST, and constant $\alpha$.

In FIG. 5A, the grounding voltage VSS floats due to voltage drop by the parasitic resistance R11 existing between NMOST and grounding voltage VSS. Therefore VSN, VSP in equation (1) are expressed as follows:

$$VSN = I_0 R11 + VSS, \quad VSP = VCC$$

where $I_0$ is the current flowing from the supply voltage VCC to the ground voltage VSS, and hence equation (1) may be rewritten as follows:

$$VTH = (\alpha I_0 R11)/(\alpha + 1) + VTH_0 \qquad (3)$$

In FIG. 5B, the supply voltage VCC is lowered due to voltage drop by the parasitic resistance R12 between the PMOST and the supply voltage VCC, and VSN, VSP in equation (1) are expressed as follows:

$$VSN = VSS, \quad VSP = VCC - I_0 R12$$

and hence equation (1) may be rewritten as follows:

$$VTH = -(\alpha I_0 R12)/(\alpha + 1) + VTH_0 \qquad (4)$$

Equations (3) and (4) indicate the deviation of the input signal A from the switching voltage of the ideal state due to the presence of parasitic resistance.

It is hence a primary object of the invention to suppress the switching level variations or deviations brought about by the parasitic resistance caused by wiring.

SUMMARY OF THE INVENTION

This invention adjusts the resistance value between the NMOST and grounding voltage VSS, or the resistance value between the PMOST and supply voltage VCC, or both resistance values so as to decrease the current flowing from the supply voltage VCC to the grounding voltage VSS. As a result, power consumption is suppressed, and floating of grounding voltage VSS and lowering of supply voltage VCC may be prevented, so that the switching level of input signal will not deviate from the target value. In other words, fluctuations of switching voltage is suppressed, and malfunction may be avoided.

DESCRIPTION OF THE PREFERRED EMBODIMENTS

Figure 1A:
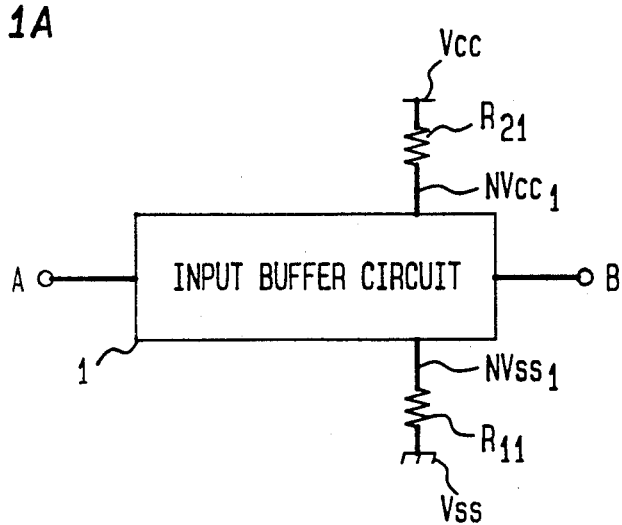
FIGS. 1A-1C show a first embodiment of the input buffer circuit of the invention.

Referring now to the drawings, several embodiments of the invention are described in detail below.

FIG. 1 is a schematic diagram of a first input buffer circuit of the invention.

FIG. 1A is a block diagram of the input buffer circuit of the invention. An input signal A is fed from an outside source (not shown) into an input buffer circuit 1. This signal is processed inside the input buffer circuit 1. The processed signal is delivered from the input buffer circuit 1 as an output signal B. At this time, the supply voltage VCC is connected to the input buffer circuit 1 by a node NVCC1 through a resistance R21 for correction of input switching level. The grounding voltage VSS is connected to the input buffer circuit 1 by a node NVSS1 through a parasitic resistance R11.

Figure 1B:
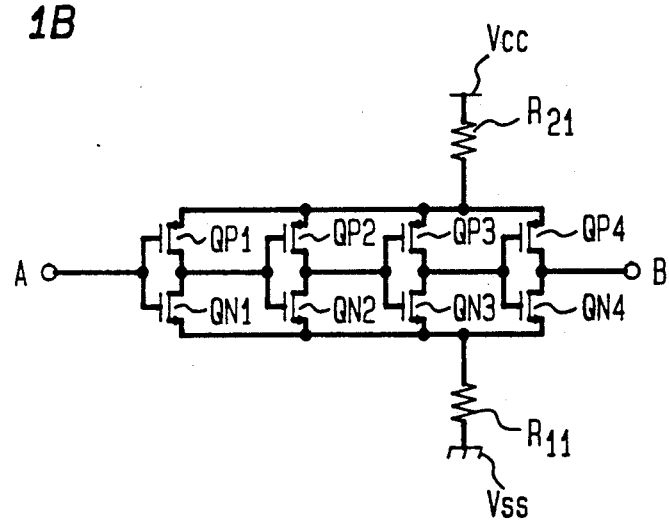

A practical first embodiment of the input buffer circuit corresponding to FIG. 1A is shown in FIG. 1B.

Symbol A is an input signal fed from an outside source (not shown), and B is an output signal taken out of the input buffer circuit. The input buffer circuit is composed of the connection of four stages of NOT circuits made of complementary MOS transistors. That is, QP1, QP2, QP3, QP4 are P-channel type MOS transistors (hereinafter called PMOSTs), and QN1, QN2, QN3, QN4 are N-channel type MOS transistors (NMOSTs). The drain electrodes of PMOSTs and source electrodes of NMOSTs are common, thereby composing the complementary MOS transistors of the first, second, third and fourth stage. An input signal A is fed commonly to the gate electrodes of the PMOST QP1 and NMOST QN1 of the first stage. The drain electrode of PMOST QP1 and source of QN1 are commonly connected, and the signal taken out from this junction is applied to the common gate electrode of the PMOST QP2 and NMOST QN2 of the second stage. The signal taken out from this junction is applied to the common gate electrode of the PMOST QP3 and NMOST QP3 of the third stage. Similarly, as for the PMOST QP4 and NMOST QN4 of the fourth stage, the output signal delivered from the complementary MOS transistor of the third stage is supplied, and an output signal B is taken from the junction of the drain and source electrodes.

In FIG. 1B, the source electrodes of all PMOSTs are common, and are connected to the supply voltage VCC through the resistance R21 for correction of the input switching level. The sources electrodes of all NMOSTs are also common, and connected to the grounding voltage VSS through parasitic resistance R11.

The parasitic resistance R11 is generated by the length of the wiring connecting the input buffer circuit and the grounding voltage VSS. That is, it is because the supply voltage VCC and input buffer circuit are disposed at close positions that parasitic resistance connected to the supply voltage VCC is not generated.

Thus, by connecting the resistance R21 for input switching level correction between the supply voltage VCC and the source electrodes of PMOSTs, the fluctuations of the input switching level due to the parasitic resistance R11 may be suppressed.

Figure 5A:
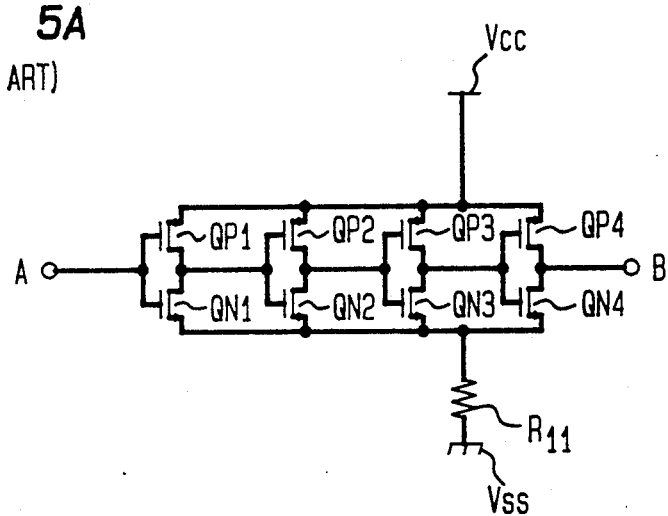
FIGS. 5A-5B are conventional input buffer circuits.
Figure 5B:
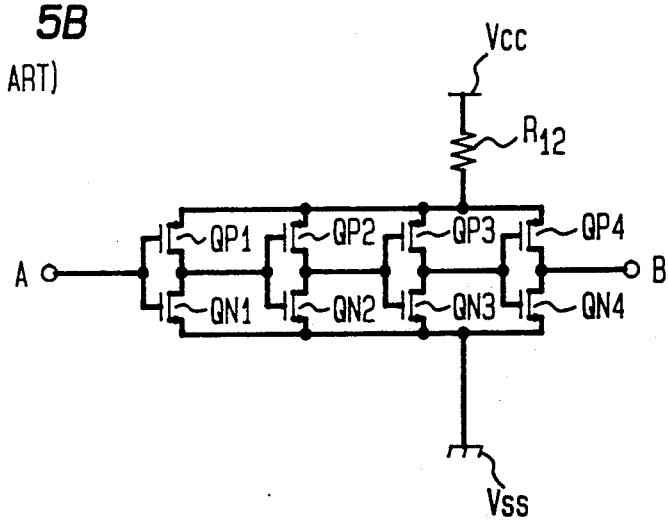
Figure 6A:
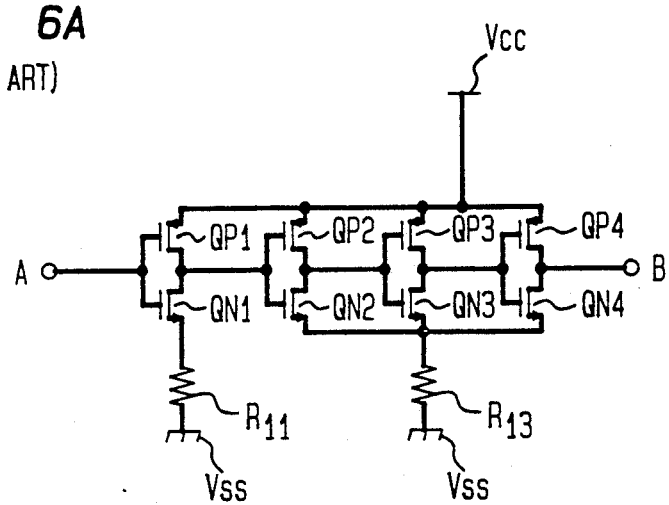
FIGS. 6A-6B are other conventional input buffer circuits.
Figure 6B:
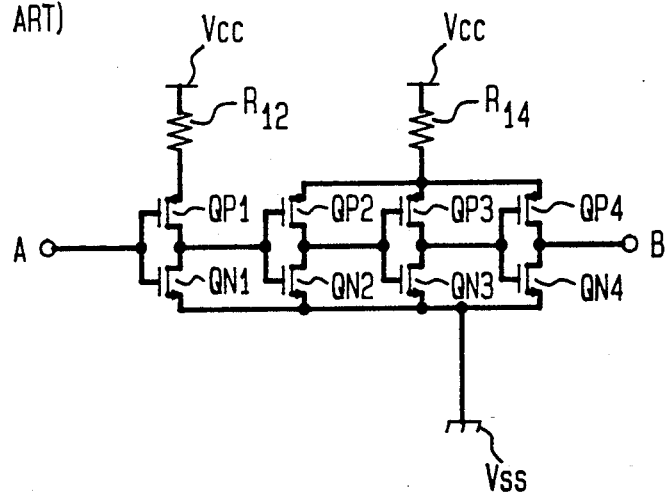

In other words, in the input buffer circuit shown in FIG. 1B, the wiring length between PMOSTs and supply voltage VCC is designed to be short, while the wiring length between NMOSTs and the grounding voltage VSS is designed to be relatively long. Accordingly, there is no parasitic resistance due to wiring at the supply voltage VCC side, and the parasitic resistance R11 due to wiring is present only at the grounding voltage VSS side. Such circuit composition is the same as in the circuit shown in FIG. 5A of the prior art. In this embodiment, in order to suppress the fluctuations of the input switching level caused by such circuit composition, a resistance R21 for correction of the input switching level is connected to the supply voltage VCC side. This may be considered as the same composition as when the circuit shown in FIG. 5B is combined in FIG.

5A. However, in the prior art, since both R11 and R12 are parasitic resistances, the resistance value is greatly influenced by the wiring length and the material of the film formed beneath or above the wiring, and in order to suppress the fluctuations of switching level by the parasitic resistances R11, R12, the circuit must be designed with many limitations.

It is hence most important to connect a resistance between the supply voltage VCC and input buffer circuit, which is capable of suppressing the fluctuations of the input switching level, with respect to the parasitic resistance R11.

That is, as mentioned in the prior art, the current flowing in the saturated region of the N-channel type MOS transistor is $IN = \gamma N(VG - VSN - VTN)^2$, where VC is gate voltage, VSN is source voltage, VTN is threshold voltage (positive value), and $\gamma N$ is a constant.

By contrast, the current flowing in the saturated region of the P-channel type MOS transistor is $IP = \gamma P(VSP - VG - VTP)^2$, where VSP is source voltage, VTP is threshold voltage (negative value), and $\gamma P$ is a constant.

The switching voltage VTH of the NOT circuit is a gate voltage to achieve the relation of IN=IP, and hence it follows that $\gamma N(VG-VSN-VTN)^2 = \gamma P(VSP-VG-VTP)^2$. Accordingly, $$VTH = (VSP + \alpha VSN + \alpha VTN + VTP)/(\alpha + 1)$$

where the constant $\alpha$ is $\alpha = (\gamma N/\gamma P)^{(1/8)}$.

In FIGS. 1A and 1B, there is a parasitic resistance R11 between the NMOST and grounding voltage VSS, and a resistance R21 for correction of input switching level is connected between the PMOSTs and supply voltage VCC, and when VSN, VSP in the above equation (1) are expressed as follows:

$$VSN = I_0 R11 + VSS$$

$$VSP = VCC - I_0 R21$$

where $I_0$ is the current flowing in the resistance.

Putting these expression in the above threshold values yields:

$$VTH = I_0/(\alpha+1) \times (\alpha R11 - R21) + VTH_0$$

where $VTH_0$ is the switching voltage in the ideal state, which may be also expressed as follows:

$$VTH_0 = (VCC + \alpha VSS + \alpha VTN + VTP)/(\alpha + 1)$$

Hence, assuming $R21 = \alpha R11$, it follows that $VTH = VTH_0$

Thus, in the case where the parasitic resistance can be ignored between the supply voltage VCC and input buffer circuit because the wiring length is short and the parasitic resistance R11 is present between the grounding voltage VSS and input buffer circuit because the wiring length is long, the switching voltage VTH of the input buffer circuit becomes the threshold value in the ideal state VTH. This is accomplished by setting the resistance for correction of input switching level at $\alpha$ times the resistance value of the parasitic resistance, that is, $\alpha = (\gamma N/\gamma P)^{(1/8)}$ times. As a result, fluctuations of input switching level due to parasitic resistance may be suppressed.

When a digital circuit is connected to the output terminal of the input buffer circuit, if the input switching level of the input buffer circuit is fluctuated, the switching voltage of components of the digital circuit also deviates. As a result, the digital circuit does not operate correctly. However, according to the embodiments shown in FIGS. 1A and 1B, such a malfunction is prevented because the input switching level barely fluctuates by the resistance R21.

In a conventional input buffer circuit, all current for driving all complementary MOS transistors flows in the parasitic resistance due to wiring caused between the input buffer circuit and the grounding voltage VSS. As a result, a voltage drop occurs in the parasitic resistance portion due to the current, and the grounding voltage VSS is caused to float. Namely, when the logic voltage of the input voltage is at a middle level M between H and L, the PMOST and NMOST to which the input signal is fed transitions to an ON state at the same time, and a large current flows from the supply voltage VCC to the grounding voltage VSS.

As explained in relation to the prior art, the switching voltage VTH is expressed as follows:

$$VTH = (VSP + \alpha VSN + \alpha VTN + VTP)/(\alpha + 1)$$

Also considering $$VSN = I_0 R11 + VSS, \, VSP = VCC$$

due to the voltage drop by the parasitic resistance R11 and the current $I_O$ flowing from the supply voltage VCC to the grounding voltage VSS, the switching voltage is $$VTH = (\alpha I_0 R11)/(\alpha + 1) + VTH_0$$

where $VTH_0$ denotes the switching voltage in the ideal state, which may be also expressed as follows:

$$VTH_0 + (VCC + \alpha VSS + \alpha VTN + VTP)/(\alpha + 1)$$

Thus, in the prior art, the switching voltage is shifted from the ideal switching voltage by $$\Delta VTH = (I_0 R11)/(\alpha + 1).$$

In this way, in the prior art, since the input switching level is deviated by the parasitic resistance, malfunctions of the circuit may occur as mentioned above.

In the circuit in FIG. 1B, the extent of such shift of the switching voltage may be decreased by connecting a resistance for correction of the input switching level to hold the relation of $R21 = \alpha R11$, between the supply voltage VCC and input buffer circuit.

Ideally, it is most desirable to connect a resistance for correction of the input switching level to hold $R21 = \alpha R11$, but it may be enough to connect a resistance R21 for correction of the input switching level to such as extent as to not cause a malfunction.

As evidenced from the equation above, it is necessary to vary the resistance value for correction of the input switching level to be connected, depending on the value of input level and value of parasitic resistance.

Practically, for example, at the parasitic resistance of R11=100 ohms, in the case of supply voltage VCC=5 volts, grounding voltage VSS=0 volt, $\alpha = (\gamma N \gamma P)^{(\frac{1}{2})} = 1.1$, the current flowing in the circuit is $I_0 = 4$ milliamperes. In the input buffer circuit of the prior art in which the resistance for correction of input switching level is R21=0 ohm, the voltages are VSN=$I_0$R11+VSS=0.40 volt, VSP=VCC−$I_0$R21=5.00 volts, and hence the switching voltage is VTH=(VSP+$\alpha$VSN+$\alpha$VTN+VTP)/($\alpha$+1)=3.18 volts. At this time, the ideal switching voltage VTH$_0$=2.98 volts is obtained. Thus, in the conventional input buffer circuit deviates from the ideal switching voltage by $\Delta$VTH=($\alpha$IR)/($\alpha$+1)=0.2 volt.

In this embodiment, on the other hand, when the resistance R21=$\alpha$R11=110 ohms for correction of the input switching level is connected, the voltages become VSN=$I_0$R11+VSS=0.4 volt, VSP=VCC−$I_0$R21=4.56 volts, and the switching voltage is VTH=(VSP+$\alpha$VSN+$\alpha$VTN+VTP)/($\alpha$+1)=2.98 volts, which is known to coincide with the ideal switching voltage VTH$_0$.

Particularly in the prior art, when a plurality of input buffer circuits are incorporated in a semiconductor substrate, the current $I_0$ increases, and the voltage drop becomes larger. Thus, the deviation $\Delta$VTH from the ideal threshold voltage increases. However, this deviation from the ideal state does not occur in the present invention.

Figure 1C:
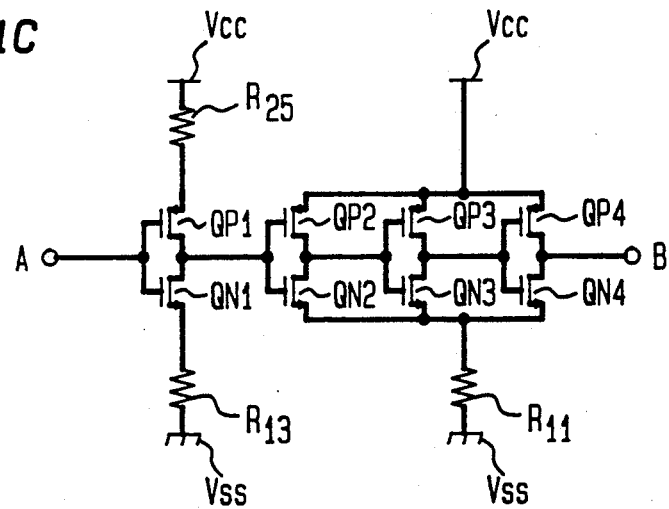

A second embodiment modifying the input buffer circuit in FIG. 1B is shown in FIG. 1C.

As in FIG. 1B, A is an input signal, and B is an output signal taken out of the input buffer circuit. The input buffer circuit is composed of the connection of four stages of NOT circuits made of complementary MOS transistors. That is, QP1, QP2, QP3, QP4 are PMOSTs, and QN1, QN2, QN3, QN4 are NMOSTs. The drain electrodes of PMOSTs and source electrodes of NMOSTs are common, composing the complementary MOS transistor of the first, second, third and fourth stages. In the first place, an input signal A is fed commonly to the gate electrodes of the PMOST QP1 and NMOST QN1 of the first stage. The drain electrode of PMOST QP1 and source electrode of NMOST QN1 are connected, and the signal taken out from their junction is applied to the gate electrodes of PMOST QP2 and NMOST QN2 of the second stage. Similarly, the drain electrode of PMOST QP1 and source electrode of NMOST QN1 of the second stage are connected, and the signal taken out from their junction is applied to the gate electrodes of PMOST QP3, and NMOST QN3 of the third stage. Likewise, the output of the complementary MOS transistor of the third stage is applied to PMOST QP4 and NMOST QN4 of the fourth stage, and an output signal B is taken from the junction of the source and drain electrodes.

The source electrodes of PMOSTs QP2, QP3, QP4 of PMOST are common and connected to the supply voltage VCC. The source electrodes of QN2, QN3, QN4 of NMOST are also common, and are connected to the grounding voltage VSS through the parasitic resistance R11. The composition is substantially the same as the prior art shown in FIG. 5A, and therefore the input switching level varies. In order to solve this problem in this embodiment, complementary MOS transistors composed of PMOST QP1 and NMOST QN1 of the first stage of the input buffer circuit is provided. In addition, a common input signal A is applied to the gate electrodes of both transistors, and an output to be used as an input to the complementary MOS transistor of the second stage is taken from between the drain and source electrodes of the both transistors of the first stage.

Furthermore, the source electrode of PMOST QP1 of the first stage is connected to the supply voltage VCC through the resistance R25 for correction of input switching level. The source electrode of NMOST QN1 is connected to the grounding voltage VSS through the parasitic resistance R13.

In this configuration, fluctuation of the input switching level due to parasitic resistance R11, R13 can be suppressed.

In the circuit of FIG. 1C, the complementary MOS transistors QN1, QP1 of the first stage are connected with the complementary transistors of the second stage to the fourth stage QN2, QN3, QN4, QP2, QP3, QP4 independently at the supply voltage VCC and grounding voltage VSS. The input switching level of the first stage is stabilized by the resistance R25 for correction of the input switching level. After the second stage, since the circuit is the same as in the prior art, the input switching levels of the second to the fourth stage fluctuate.

In the input buffer circuit in FIG. 1C, there are complementary MOS transistors QN1, QP1 of the first stage that determine the input switching level applied from outside. Therefore, the output voltage level of the output signal B does not fluctuate.

Accordingly, supposing the driving capacities of the complementary transistors QN1 or QN4, and QP1 or QP4 to be nearly equal to each other, when the parasitic resistances R13, R11 are in a ratio of 1:3, and the resistance R25 for correction of input switching level is formed for the same purpose as in FIG. 1B, the same effect as in FIG. 1B is obtained. When the parasitic resistance R13 is set to a value which is as small as possible by determining the ratio of division of the parasitic resistances R13 and R11 to be, for example, 1:2, deviation from the ideal switching voltage may be decreased. This is true even if the resistance R25 for correction of the input switching level fluctuates.

In this way, by setting the complementary MOS transistors QN1, QP1 of the first stage independently, the absolute amount of the current flowing in the parasitic resistance R13 of the circuit of the first stage may be decreased. This is the most effective method for eliminating the malfunctions by suppressing the fluctuations of the input switching level.

That is, when both input buffer circuits in FIG. 1B and FIG. 1C are compared, the input buffer circuit of FIG. 1C is found to have smaller fluctuations of input switching level.

In order to realize the input buffer circuit in FIG. 1C, it is necessary to compensate for the parasitic resistance R13 of the first stage. Since the parasitic resistance R11, R13 are brought about by wiring, the area of the wiring may be determined by dividing the same wiring as in the parasitic resistance formed in FIG. 1B. This is determined by dividing into the parasitic resistances R11 and R13 so as to achieve the desired parasitic resistance value, so that it is not necessary to increase the total area of the wiring.

Figure 2A:
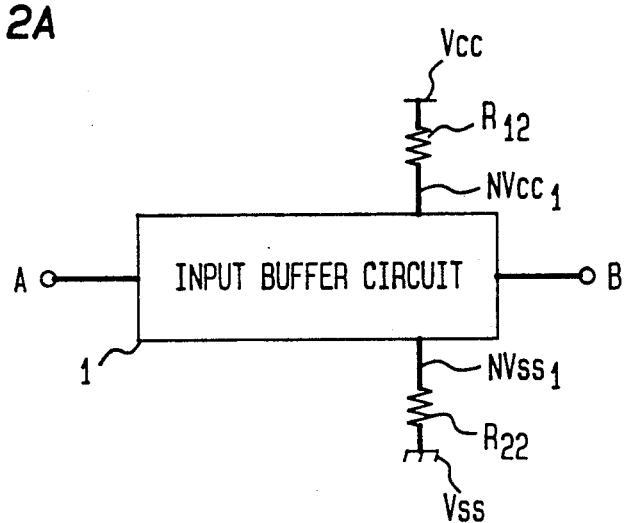
FIGS. 2A-2C show a second embodiment of the input buffer circuit of the invention.

FIG. 2A is a block diagram of a second input buffer circuit of the invention. As in the first input buffer circuit, an input signal A is fed into the input buffer circuit 1 from an outside source (not shown). This signal is processed inside the input buffer circuit 1. The processed signal is delivered from the input buffer circuit as an output signal B. At this time, the grounding voltage VSS is connected with the input buffer circuit 1 by a node NVSS1 and through a resistance R22 for correction of input switching level. The supply voltage VCC is connected with the input buffer circuit 1 by a node NVCC1 through the parasitic resistance R12.

Figure 2B:
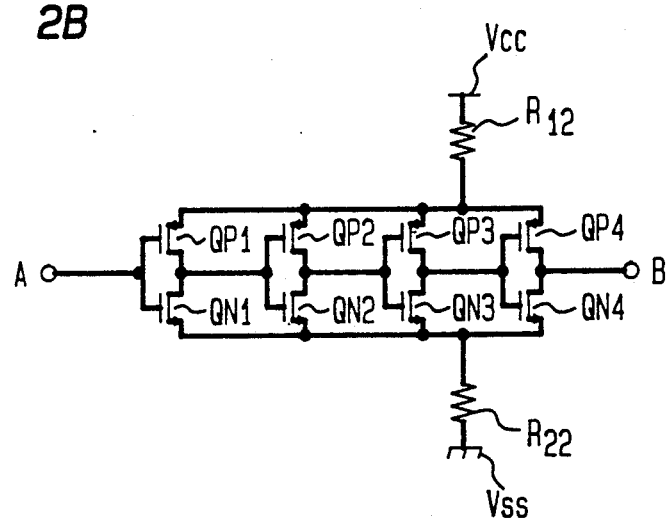

A first embodiment of the practical input buffer circuit corresponding to block 1 in FIG. 2A is shown in FIG. 2B.

A is an input signal fed from an outside source (not shown), and B is an output signal taken from the input buffer circuit. The input buffer circuit is composed by the connection of four stages of NOT circuits made of complementary MOS transistors. QP1, QP2, QP3, QP4 are PMOSTs. QN1, QN2, QN3, QN4 are NMOSTs. The drain electrode of the PMOST and source electrode of NMOST are common, composing the complementary MOS transistors of each stage. First, an input signal A is fed commonly to the gate electrodes of PMOST QP1 and NMOST QN1 of the first stage. The drain electrode of PMOST QP1 and source electrode of NMOST QN1 are connected, and the signal taken from their junction is applied to the gate electrodes of the PMOST QP2 and NMOST QN2 of the second stage. Similarly, the drain electrode of PMOST QP1 and source electrode of NMOST QN1 of the second stage are connected, and the signal taken from their junction is applied to the gate electrodes of the PMOST QP3 and NMOST QN3 of the third stage. The output signal of the complementary MOS transistor of the third stage is fed to the PMOST QP4 and NMOST QN4 of the fourth stage, and the output signal B is taken from the connected portion of the drain electrode of PMOST QP4 and source electrode of NMOST QN4.

The source electrodes of all PMOSTs are common, and are connected to the supply voltage VCC through the parasitic resistance R12. The source electrodes of all NMOSTs are also common, and are connected to the grounding voltage VSS through the resistance R22 for correction of the input switching level.

In FIG. 2B, when designing this circuit, the wiring length between the PMOSTs and supply voltage VCC is relatively long, while the wiring length between the NMOSTs and grounding voltage VSS is relatively short to compose the input buffer circuit. Accordingly, at the grounding voltage VSS side, there is no parasitic resistance due to wiring, and the parasitic resistance R12 is present at the supply voltage VCC side. Such circuit composition corresponds to the prior art in FIG. 5B. In this embodiment, in order to suppress the fluctuations of the input switching level caused by such circuit composition, the resistance R22 for correction of the input switching level is connected at the grounding voltage VSS side. Such composition may be considered similar to the application of the circuit in FIG. 5B to FIG. 5A. However, in the prior art, since R11, R12 are parasitic resistances, the input switching level is influenced by the wiring length and the material of the film formed beneath or above the wiring. In order to suppress the fluctuations of switching level due to parasitic resistances R11, R12, many limitations are applied to the circuit to be designed.

It is hence most important to add such resistance to suppress the fluctuations of the input switching level against parasitic resistance R12.

In FIG. 2A and 2B, as in FIG. 1A, there is a parasitic resistance R12 between the PMOSTs and supply voltage VCC, and a resistance R22 for correction of the input switching level is connected between the NMOSTs and grounding voltage VSS. Therefore VS, VSP of equation (1) shown in the prior art may be expressed respectively as follows:

$$VSN = I_0R22 + VSS$$

$$VSP = VCC - I_0R12$$

where $I_0$ is the current flowing in the resistance.

Putting these expressions in an equation (1), the switching voltage VTH is as follows:

$$VTH = I_0/(\alpha + 1) \times (\alpha R22 - R12) + VTH_0$$

Accordingly, supposing $R22 = R12/\alpha$, it follows that $VTH = VTH_0$.

Thus, in the case where the parasitic resistance can be ignored because the wiring length between the grounding voltage VSS and input buffer circuit is short and the parasitic resistance R12 is present because the wiring length between the supply voltage VCC and input buffer circuit is long, the switching voltage VTH of the circuit becomes the switching voltage in ideal state $VTH_0$. This is accomplished by setting the resistance for correction of the input switching level to $1/\alpha$ times the resistance value of the parasitic resistance, that is, $(1/\alpha = 1/\gamma N/\gamma P) = (\frac{1}{2})$, so that the fluctuations of the input switching level due to parasitic resistance may be suppressed.

As explained in relation to the prior art, the switching voltage VTH is expressed as follows:

$$VTH = (VSP + \alpha VSN + \alpha VTN + VTP)/(\alpha + 1)$$

Due to the voltage drop due to parasitic resistance R, considering $$VSN = VSS, \ VSP = VCC - I_0R.$$

then the switching voltage will be $VTH = -(\alpha I_0R)/(\alpha + 1) + VTH_0$, where $VTH_0$ is the switching voltage in ideal state.

That is, in the prior art, the switching voltage is shifted from the ideal supplying voltage by $\Delta VTH = -(\alpha I_0R)/(\alpha + 1)$.

Thus, in the prior art, the input switching level is deviated by the parasitic resistance, and hence the circuit malfunctions.

In the circuit in FIG. 2B, the extent of the switching voltage shift may be reduced by connecting a resistance for correction of input switching level to hold the relation of $R22 = R12/\alpha$ between the grounding voltage VSS and the input buffer circuit.

Ideally, it is best to connect the resistance for correction of the input switching level to establish $R22 = R12\alpha$. However, it is sufficient to insert the resistance R22 for correction of the input switching level so as not to cause malfunction.

In addition, as clear from the above expression, it is necessary to vary the value of resistance for correction of the input switching level depending on the value of the input level and the value of the parasitic resistance.

For example, at the parasitic resistance of R12 = 100 ohms, in the case of supply voltage VCC = 5 volts, grounding voltage VSS = 0 volt, and $\alpha = (\gamma N/\gamma P)^{(\frac{1}{2})} = 1.1$, the current flowing in the circuit is $I_0 = 4$ milliamperes. In the input buffer circuit of the prior art in which the resistance for correction of input switching level is R22=0 ohm, the voltages are VSN=I₀R22+VSS=0 volt, VSP=VCC−I₀R12=4.60 volts, and therefore the switching voltage is VTH=(VSP+αVSN+αVTN+VTP)/(α+1)=2.79 volts. The ideal switching voltage VTH₀ is 3.00 volts. Thus, in the conventional input buffer circuit, there is a deviation of ΔVTH=(αIR)/(α+1)=0.21 volt from the ideal switching voltage.

On the other hand, in this embodiment shown in FIG. 2B, when the resistance for correction of input switching level of R22=R12/α=91 ohms is connected, the voltages are VSN=I₀R22+VSS=0 volt, VSP=VCC−I₀R12=4.60 volts. Hence, the switching voltage is VTH=(VSP+αVSN+αVTN+VTP)/(α+1)=3.00 volts, which is known to agree with the ideal switching voltage VTH₀.

In particular, when a plurality of input buffer circuits are incorporated in a semiconductor substrate, plurality, the current I₀ increases and the voltage drop is larger. In the prior art the deviation ΔVTH from the ideal threshold voltage increases. A deviation from the ideal state does not occur in the present invention.

Figure 2C:
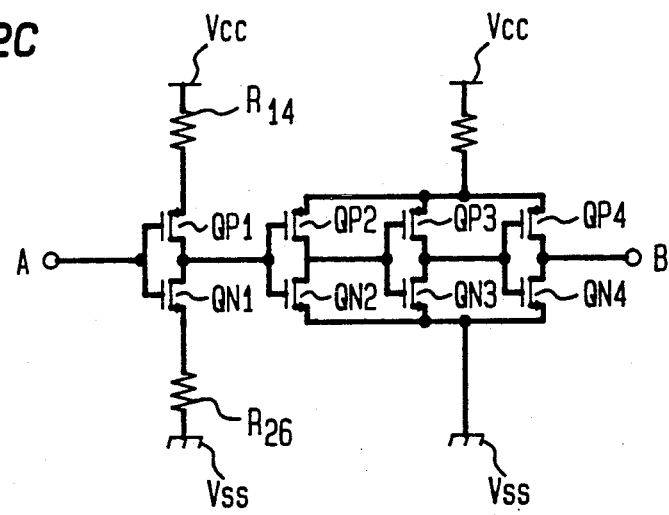

A second embodiment including a modification of the input buffer circuit of FIG. 2B is shown in FIG. 2C.

As in FIG. 2B, A is an input signal, and B denotes an output signal taken from the input buffer circuit. The input buffer circuit is composed by the connection of four stages of NOT circuits made of complementary MOS transistors. That is, QP1, QP2, QP3, QP4 are PMOSTs, and QN1, QN2, QN3, QN4 are NMOSTs. The drain of the PMOST and source electrode of NMOST are common to compose the complementary MOS transistors of one stage. First, an input signal A is fed commonly to each gate electrodes of the PMOST QP1 and NMOST QN1 of the first stage. The drain electrode of PMOST QP1 and source electrode of NMOST QN1 are connected, and the signal taken from their junction is applied to the gate electrodes of the PMOST QP1 and NMOST QN2 of the second stage. Similarly, the drain electrode of PMOST QP1 and source electrode of NMOST, QN1 of the second stage are connected, and the signal taken from their junction is applied to the gate electrodes of the PMOST QP3 and NMOST QN3 of the third stage. Likewise, the output of the complementary MOS transistors of the third stage is fed to the PMOST QP4 and NMOST QN4 of the fourth stage, and the output signal B is taken from the connected portion of the drain electrode of PMOST QP4 and source electrode of NMOST QN4.

The source electrodes of PMOSTs QP2, QP3, QP4 are common, and connected to the supply voltage VCC through the parasitic resistance R12. The source electrodes of the NMOSTs QN2, QN3, QN4 are also common, and connected to the grounding voltage VSS. This composition is substantially the same as the circuit shown in the prior art in FIG. 5B. Thus, the input switching level fluctuates. In this embodiment, accordingly, there is a complementary MOS transistor composed of PMOST QP1 and NMOST QN1 of the first stage and a common input signal A is applied to the gate electrodes of the both transistors QP1, QN1. The output to be used as the input signal to the complementary MOS transistor of the second stage is taken from between the drain and source electrodes of both the transistors QP1, QN1.

The source electrode of PMOST QP1 of the first stage is connected to the grounding voltage VSS through the resistance R26 for correction of input switching level. The source electrode of PMOST QP1 is connected to the supply voltage VCC through the parasitic resistance R14.

In this embodiment, fluctuations of the input switching level by the parasitic resistances R12, R14 can be suppressed.

In the circuit in FIG. 2C, the complementary MOS transistors QN1, QP2 of the first stage are connected to the supply voltage VCC and grounding voltage VSS independently of the complementary transistors QN2, QN3, QN4, QP2, QP3, QP4 of the second to the fourth stages. The input switching level of the first stage is stabilized by the resistance R26 for correction of the input switching level. The second and following stages are same as in the circuit of the prior art, and hence the input switching level of the second to the fourth stage fluctuates.

However, the complementary MOS transistors QN1, QP1, of the first stage determine the input switching level supplied from outside. Therefore, the output voltage level of the output signal B does not fluctuate.

Accordingly, supposing the driving capacities of the complementary transistors QN1 or QN4, and QP1 or QP4 to be nearly equal to each other, when the parasitic resistances R14, R12 are in a ratio of 1:3, and the resistance R26 for correction of the input switching level is formed as in FIG. 2B, the same effect as in FIG. 1B is obtained. When the parasitic resistance R14 is set as small as possible by determining the ratio of the parasitic resistances R14 and R12 to be 1:2, for example, deviation from the ideal switching voltage may be decreased even if the resistance R26 for correction of the input switching level fluctuates.

In this way, by independently setting the complementary MOS transistors QN1, QP1 of the first stage, the absolute amount of the current flowing in the parasitic resistance R14 of the circuit of the first stage may be decreased. This is the most effective method for eliminating the malfunctions by suppressing the fluctuations of the input switching level.

When the input buffer circuits in FIG. 2B and FIG. 2C are compared, the input buffer circuit of FIG. 2C is found to have smaller fluctuations of the input switching level.

In the designing aspect, moreover, in order to realize the input buffer circuit in FIG. 2C, it is necessary to make up the parasitic resistance R14 of the first stage. Since the parasitic resistances R12, R14 are brought about by the wiring, the area of the wiring may be determined by dividing the same wiring as in the parasitic resistance formed in FIG. 2B. This is accomplished by dividing into the parasitic resistances R12 and R14 so as to achieve the desired parasitic resistance value, so that it is not necessary to increase the total area of the wiring.

Figure 3A:
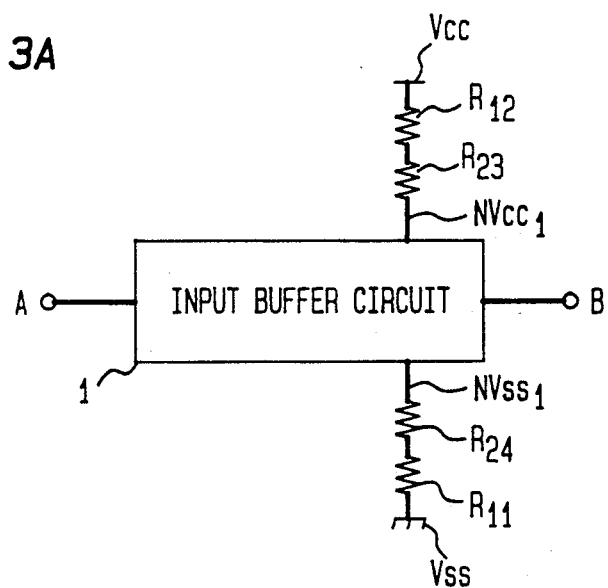
FIGS. 3A-3C show a third embodiment of the input buffer circuit of the invention.

FIG. 3A is a block diagram of a third input buffer circuit of the invention. As in the first input buffer circuit, an input signal A is fed into the input buffer circuit 1 from an outside source (not shown). This signal is processed inside the input buffer circuit 1. The processed signal is delivered from the input buffer circuit as an output signal B. At this time, the grounding voltage VSS is connected with the input buffer circuit 1 by a node NVSS1 through a parasitic resistance R11 and a resistance R24 for correction of input switching level. On the other hand, the supply voltage VCC is connected with the input buffer circuit 1 by a node NVCC1 through a parasitic resistance R12 and a resistance R23 for correction of input switching level.

Figure 3B:
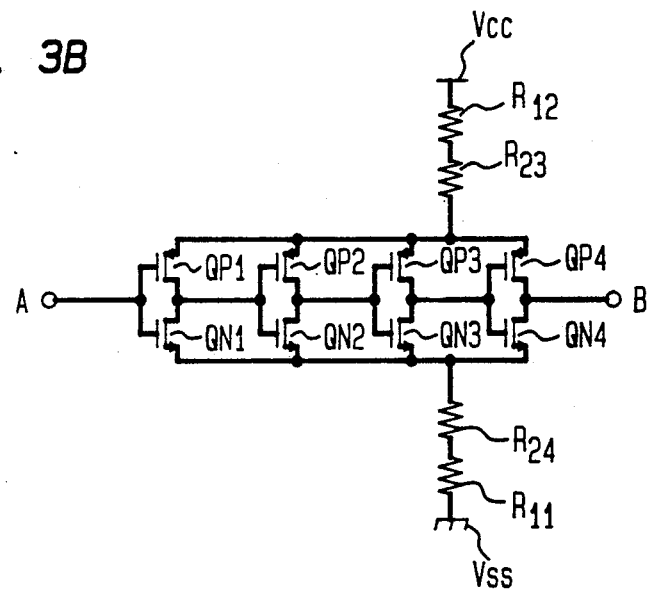

A first embodiment of the practical input buffer circuit corresponding to the block diagram 1 in FIG. 3A is shown in FIG. 3B.

A is an input signal fed from an outside source (not shown), and B is an output signal taken from the input buffer circuit. The input buffer circuit is composed by connection of four stages of NOT circuits made of complementary MOS transistors. That is, QP1, QP2, QP3, QP4 are PMOSTs, and QN1, QN2, QN3, QN4 are NMOSTs. The drain electrode of PMOST and the source electrode of NMOST are common, composing the complementary MOS transistor of each stage. First, an input signal A is fed commonly to the gate electrodes of PMOST QP1 and NMOST QN1 of the first stage. The drain electrode of PMOST QP1 and source electrode of NMOST QN1 are connected, and the signal taken from their junction is applied to the gate electrodes of the PMOST QP2 and NMOST QN2 of the second stage. Similarly, the drain electrode of PMOST QP1 and source electrode of NMOST QN1 of the second stage are connected, and the signal taken from their junction is applied to the gate electrodes of the PMOST QP3 and NMOST QN3 of the third stage. Likewise, the output of the complementary MOS transistors of the third stage is fed to the PMOST QP4 and NMOST QN4 of the fourth stage, and the output signal B is taken from the connected portion of the drain and source electrodes.

The source electrodes of all PMOSTs are common, and are connected to the supply voltage VCC through parasitic resistance R12 and resistance R23 for correction of input switching level. The source electrodes of all NMOSTs are also common, and are connected to the grounding voltage VSS through the resistance R24 for correction of the input switching level, and the parasitic resistance R11.

The parasitic resistance and the resistance for correction of the input switching level are connected in series at both supply voltage and grounding voltage side.

FIG. 3B shows an input buffer circuit in which the wiring length between the PMOSTs and supply voltage VCC is relatively long, and the wiring length between the NMOSTs and grounding voltage VSS is also relatively long. Accordingly, at the grounding voltage VSS side, there is a parasitic resistance R11 due to wiring, and the parasitic resistance R12 is also present at the supply voltage VCC side. The construction shown in FIG. 3B is more flexible in designing a circuit than that of FIG. 1 or FIG. 2. In this embodiment, in order to suppress the fluctuations of the input switching level caused by such circuit composition, the resistances R23 and R24 for correction of the input switching level are connected to the parasitic resistances R11 and R12 respectively. Such composition may be considered similar to the application of the circuit in FIG. 5B and FIG. 5A. However, in the prior art, since R11, R12 are parasitic resistances. Such composition is influenced by the wiring length and the material of the film formed beneath or above the wiring. In order to suppress the fluctuations of switching level due to parasitic resistances R11, R12, many limitations are applied to the circuit to be designed.

It is hence most important to add such resistance as to suppress the fluctuations of the input switching level against parasitic resistances R11, R12.

As mentioned in FIG. 1A, in FIGS. 3A and 3B, there are parasitic resistance R12 and resistance R23 between the PMOSTs and supply voltage VCC, and a resistance R24 for correction of the input switching level and parasitic resistance R11 are connected between the NMOSTs and grounding voltage VSS. Therefore VS, VSP of equation (1) shown in the prior art may be expressed respectively as follows.

$$VSN = I_0(R11+R24) + VSS$$

$$VSP = VCC - I_0(R12+R23)$$

where $I_0$ is the current flowing in the resistance.

Putting these expressions in equation (1), the switching voltage VTH is as follows:

$$VTH = I_0/(\alpha+1) \cdot \times [\alpha(R11-R24)-(R12+R23)] + VTH_0$$

Accordingly, supposing $R12+R23 = \alpha(R11+R24)$, then it follows that $VTH = VTH_0$.

Thus, in the case where the wiring resistance from the grounding voltage VSS to the input buffer circuit cannot be ignored and the wiring resistance from the supply voltage VCC to the input buffer circuit also cannot be ignored, by setting the sum of the resistance connected to the supply voltage VCC side or the sum of the resistance values of the resistance R23 for correction of input switching level and the parasitic resistance R12, to $\alpha$ times, namely $\alpha = (\gamma N/\gamma P)^{(\frac{1}{2})}$ times the sum of the resistances connected to the grounding voltage VSS side or the sum of the resistance values of the resistance R24 for correction of input switching level and the parasitic resistance R11, the switching voltage VTH of the circuit becomes the ideal state switching voltage $VTH_0$. Thus, the fluctuations of the input switching level due to parasitic resistances R11, R12 may be suppressed.

In the prior art, the switching voltage is shifted from the ideal switching voltage by $$\Delta VTH = [\alpha I_0(R11+R24) - I_0(R12+R23)]/(\alpha+1).$$

Thus, in the prior art, the input switching level varies depending on the parasitic resistance R11, R12, and hence the malfunction of circuit occurs.

In the circuit in FIG. 3B, the extent of such shift of switching voltage may be decreased by connecting the resistance R24 for correction of input switching level between the grounding voltage VSS and input buffer circuit, and the resistance R23 for correction of input switching level between the supply voltage VCC and input buffer circuit.

Ideally, it is best to connect a resistance for correction of the input switching level to establish the relation of $R12+R23 - \alpha(R11+R24)$. However, it is sufficient to connect resistances R23, R24 for correction of input switching level to such an extent as to not cause a malfunction.

Figure 3C:
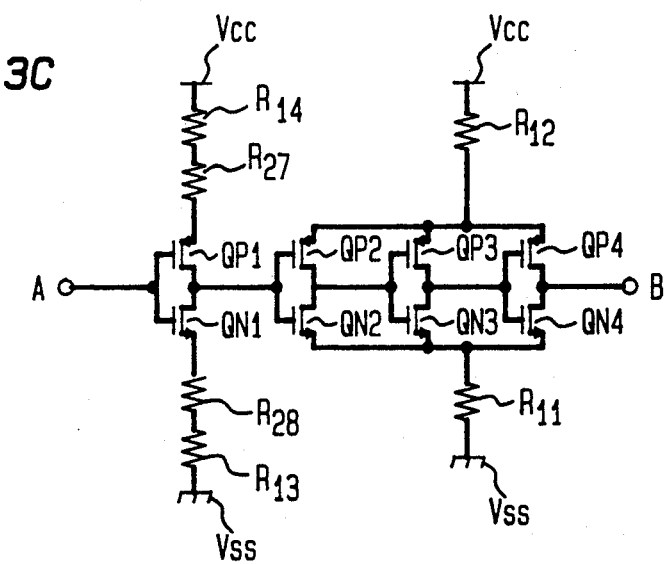

Another embodiment for modifying the input buffer circuit in FIG. 3B is shown in FIG. 3C.

As in FIG. 3B, A is an input signal, and B denotes an output signal taken from the input buffer circuit. The input buffer circuit is composed by connection of four stages of NOT circuits made of complementary MOS transistors. That is, QP1, QP2, QP3, QP4 are PMOSTs, and QN1, QN2, QN3, QN4 are NMOSTs. The drain electrode of PMOST and source electrode of NMOST are common to compose the complementary MOS transistors of each stage. First, an input signal A is fed commonly to the gate electrodes of the PMOST QP1 and NMOST QN1 of the first stage. The drain electrode of PMOST QP1 and source electrode of NMOST QN1 are connected, and the signal taken from their junction is applied to the gate electrodes of the PMOST QP2 and NMOST QN2 of the second stage. Similarly, the drain electrode of PMOST QP2 and source electrode of NMOST QN2 of the second stage are connected, and the signal taken from their junction is applied to the gate electrodes of the PMOST QP3 and NMOST QN3 of the third stage. Likewise, the output signal of the complementary MOS transistors of the third stage is fed to the PMOST QP4 and NMOST QN4 of the fourth stage, and the output signal B is taken out from the connected portion of the drain and source electrodes.

The source electrodes of PMOSTs QP2, QP3, QP4 are common, and are connected to the supply voltage VCC through the parasitic resistance R12, and the source electrodes of NMOSTs QN2, QN3, QN4 are also common, and connected to the grounding voltage VSS through the parasitic resistance R11. Thus, it is substantially the same as the combination of the circuits in FIGS. 5A and 5B in the prior art, and hence the input switching level fluctuates. Accordingly, in this embodiment, there are complementary MOS transistors composed of PMOST QP1, NMOST QN1 of the first stage of the input buffer circuit, and a common input signal A is applied to the gate electrodes of both transistors, and the output to be used as an input signal to the complementary MOS transistors of the second stage is taken out from between the drain and source electrodes of both the transistors.

Furthermore, the source electrode of PMOST QP1 of the first stage is connected to the supply voltage VCC through the parasitic resistance 14 and the resistance R27 for correction of input switching level, and the source electrode of PMOST QP1 is connected to the grounding voltage VSS through the parasitic resistance R13 and the resistance R28 for correction of the input switching level.

In this embodiment, fluctuations of the input switching level due to the parasitic resistances R11, R12, R13, R14 can be suppressed.

In the circuit in FIG. 3C, the complementary MOS transistors QN1, QP1 of the first stage are connected to the supply voltage VCC and grounding voltage VSS independently of the complementary transistors QN2, QN3, QN4, QP2, QP3, QP4 of the second to the fourth stages. The input switching level of the first stage is stabilized by the resistances R27, R28 for correction of the input switching level. However, the second and following stages are the same as in the circuit of the prior art, and hence the input switching level of the second to the fourth stages fluctuates.

The complementary MOS transistors QN1, QP1 of the first stage determine the input switching level fed from outside. Therefore, the output voltage level of the output signal B does not fluctuate.

Accordingly, supposing the driving capacities of the complementary transistors QN1 to QN4, QP1 to QP4 to be nearly equal to each other, when the parasitic resistances R13, R11, and R14, R12 are respectively in a ratio of 1:3 and the resistance R27, R28 for correction of input switching level are formed for the same purpose as in FIG. 3B, the same effect as in FIG. 3B is obtained.

But, when the dividing ratio of the parasitic resistances R13, R11 and R14, R12 is set to 1:2, for example, to decrease the parasitic resistance R13 and R14 as far as possible, the deviation from the ideal switching voltage is set smaller even if the value of resistances R26 and R28 for correction of input switching level fluctuates.

Thus, by independently setting the complementary MOS transistors QN1, QP1 of the first stage, the absolute amount of the current flowing in the parasitic resistances R13 and R14 of the circuit in the first stage may be decreased. This is most effective for suppressing the fluctuations of input switching level and eliminating malfunctions.

That is, experimentally, when the input buffer circuits in FIG. 3B and FIG. 3C are compared, it is known that a more ideal switching voltage is obtained in FIG. 3C, and that the fluctuations of the input switching level are small.

In the designing aspect, too, in order to realize the input buffer circuit in FIG. 3C, it is necessary to make up the parasitic resistances R13 and R14 of the first stage. Since the parasitic resistances R11, R12, R13, R14 are brought about by wiring, the area of the wiring may be determined by dividing into the parasitic resistances R11 and R12, R13 and R14 so that the same wiring as in the parasitic resistance formed in FIG. 3B may achieve a desired parasitic resistance value. Thus, it is not necessary to increase the total area of the wiring.

Figure 4A:
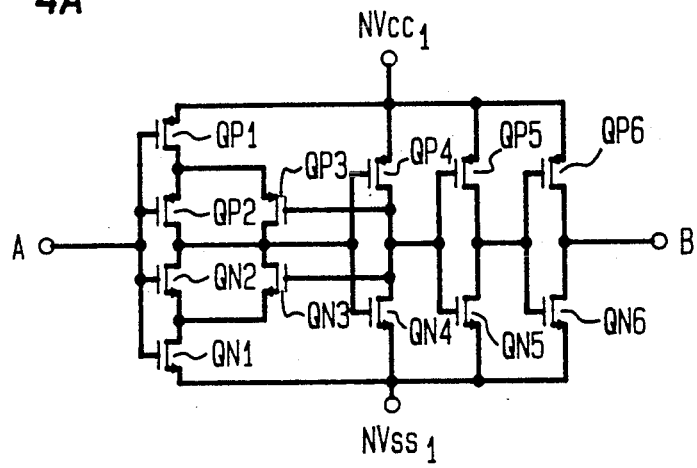
FIGS. 4A-4B show a fourth embodiment of the input buffer circuit of the invention.
Figure 4B:
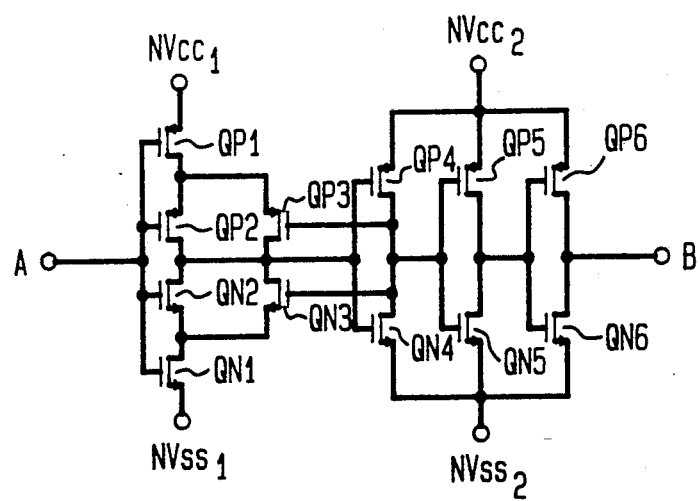

FIG. 4A and 4B show schematic diagrams of a fourth input buffer circuit of the invention.

FIG. 4A shows a fourth embodiment of the input buffer circuit of the invention.

This input buffer circuit relates to the input buffer circuit portion of the block diagram explained in FIGS. 1A, 2A, 3A and FIGS. 1B, 2B, 3B. Nothing is shown relating to the parasitic resistance connected to the input buffer circuit and the resistance for correction of the input switching level. The connecting methods of the parasitic resistance and the resistance for correction of input switching level connected in the input buffer circuit shown in FIG. 4 are available in six varieties as shown in FIGS. 1A, 2A, 3A and FIGS. 1B, 2B, 3B.

A is an input signal from an outside source (not shown), and B is an output signal taken from the input buffer circuit. The input buffer circuit is composed of complementary MOS transistors. That is, QP1, QP2, QP3, QP4, QP5, QP6 are PMOSTs, and QN1, QN2, QN3, QN4, QN5, QN6 are NMOSTs. The drain electrodes of PMOSTs QP4, QP5, QP6 are common and connected to the node NVCC1. The source electrodes of NMOSTs QN4, QN5, QN6 are common and connected to the node NVSS1.

The input signal A is applied to the gate electrodes of four MOS transistors QP1, QP2, QN1, QN2. The drain electrode of PMOST QP1 and source electrode of PMOST QP2, and drain electrode of PMOST QP1 and source electrode of PMOST QP3 are connected respectively. The drain electrode of NMOST QN1 and source electrode of NMOST QN2, and drain electrode of NMOST QN1 and source electrode of PMOST QP3 are connected respectively. Furthermore, the drain electrode of PMOST QP2 and NMOST QN2 are common, and the drain electrodes of PMOST QP3 and NMOST QN3 are commonly connected to compose the complementary MOS transistors.

The source electrode of PMOST QP1 is common with the source electrodes of PMOSTs QP4, QP5, QP6 and is connected to the node NVCC1, and similarly the source electrode of NMOST QN1 is common with the source electrodes of NMOSTs QN4, QN5, QN6 and is connected to the node NVSS1.

The common drain electrodes of PMOST QP2 and NMOST QN2, and the common drain electrodes of PMOST QP4 and NMOST QN4 are connected and are further connected with the gate electrodes of PMOST QP4, NMOST QN4.

The gate electrodes of PMOST QP8 and NMOST QN8 are connected to the drain electrodes of PMOST QP4 and NMOST QN4.

Thus, the input signal A is processed through PMOSTs QP1, QP2, QP3 and NMOSTs QN1, QN2, QN3, and its output is fed to the gate electrodes of PMOSTs QP4, NMOST QN4. Furthermore, the drain voltages of PMOST QP4, NMOST QN4 are fed back to the gate electrodes of PMOST QP3, NMOST QN3.

The signals delivered from the drain electrodes of PMOST QP4, NMOST QN4 are fed into the gate electrode of the complementary MOS transistors composed of QP5 and QN5. The signals delivered from the drain electrodes of PMOST QP5, NMOST QN5 are fed into the gate electrodes of PMOST QP6, NMOST QN6, and the output signal B is taken out of the drain electrodes of PMOST QP6, NMOST QN6.

In this input buffer circuit, the circuit portion composed of QP1, QP2, QP3, and QN1, QN2, QN3 has a hysteresis characteristic.

When the input signal A changes from L to H, if the input signal A is L, PMOSTs QP1, QP2, QP3 are in a conductive state, while the NMOSTs QN1, QN2, QN3 are in a nonconductive state. Therefore the input switching level is shifted to the L side. When the input signal A is H, PMOSTS QP1, QP2, QP3 are non-conductive, while the NMOSTs QN1, QN2, QN3 are conductive, and the input switching level is shifted to the H side. Accordingly, even if the input switching level of the input signal A is an intermediate potential, the output signal B to be delivered tends to be established either at the L or H side. In this embodiment, the current flowing in the circuits of FIGS. 1A, 2A, 3A and FIGS. 1B, 2B, 3B decreases, and the input switching level is stabilized.

FIG. 4B show a fifth embodiment of the input buffer circuit of the invention.

This input buffer circuit relates to the input buffer circuit portion of the block diagram explained in FIGS. 1C, 2C, 3C. That is, nothing is mentioned about the parasitic resistance and resistance for correction of the input switching level connected to the input buffer circuit, and the connecting methods of the parasitic resistance and resistance for correction of input switching level connected to the input buffer circuit shown in FIG. 4B are available in three varieties as shown in FIGS. 1C, 2C, 3C.

A is an input signal fed from an outside source (not shown), and B is an output signal taken out from the input buffer circuit. The input buffer circuit is composed of complementary MOS transistors. That is, QP1, QP2, QP3, QP4, QP5, QP6 are PMOSTs, and QN1, QN2, QN3, QN4, QN5, QN6 are NMOSTs. The drain electrodes of PMOSTs QP4, QP5, QP6 are common and connected to the node NVCC2. The source electrodes of NMOSTs QN4, QN5, QN6 are common and connected to the node NVSS2.

The input signal A is connected to the gate electrodes of four MOS transistors QP1, QP2, QN1, QN2. The drain electrodes of PMOSTs QP1 and source electrodes of PMOST QP2, and drain electrodes of PMOST QP1 and source electrode of PMOST QP3 are connected respectively. The drain electrodes of NMOST QN1 and source electrodes of NMOSTs QN2, and drain electrodes of NMOST QN1 and source electrode of NMOST QN3 are connected respectively. The drain electrodes of PMOST QP2 and NMOST QN2 are common, and the drain electrodes of PMOST QP3 and NMOST QN3 are commonly connected to compose the complementary MOS transistors respectively.

The source electrode of PMOST QP1 is connected to the node NVCC1. The source electrode of NMOST QN1 is connected to node NVSS1.

The node NVCC1 corresponds to the connection point of PMOST QP1 and resistance R27 shown in FIGS. 3C. The mode NVSS1, similarly corresponds to the connection point of NMOST QN1 and resistance R28 shown in FIG. 3C. The node NVCC2 corresponds to the connection point of the common source electrodes PMOSTs QP2, QP3, QP4 and resistance R12 shown in FIG. 3C. The node NVSS2 corresponds to the connection point of the common source electrodes of NMOST QN2, QN3, QN4 and resistance R11 shown in FIG. 3C.

The common drain electrodes of PMOST QP2 and NMOST QN2 and the common drain electrodes of PMOST QP4 and NMOST QN4 are connected to each other, and they are also connected to the gate electrodes of PMOST QP4, NMOST QN4.

The gate electrode of PMOST QP3 and NMOST QN3 are connected to the drain electrodes of PMOST QP4 and NMOST QN4, respectively.

Thus, the input signal A is processed through PMOSTs QP1, QP2, QP3, and NMOSTs QN1, QN2, QN3, and its output signal is fed to the gate electrodes of PMOST QP4, NMOST QN4. Furthermore, the drain voltages of PMOST QP4, NMOST QN4 are fed back to the gate electrodes of PMOST QP3, NMOST1 QN3.

The signals delivered from the drain electrodes of PMOST QP4, NMOST QN4 are fed into the gate electrodes of the complementary MOS transistors QP5, QN5 and the signals delivered from the drain electrodes of PMOST QP5, NMOST QN5, are fed into the gate electrodes of PMOST QP6, NMOST QN6, and the output signal B is taken out of the drain electrodes of PMOST QP6, NMOST QN6.

In this input buffer circuit, the circuit portion composed of PMOSTs QP1, QP2, QP3, and NMOSTs QN1, QN2, QN3 has a hysteresis characteristic.

When the input signal A changes from L to H, if the input signal A is L, PMOSTs QP1, QP2, QP3 are in a conductive state, while NMOSTs QN1, QN2, QN3 are in a nonconductive state, the input switching level is shifted to the L side. When the input signal A is H, PMOSTs QP1, QP2, QP3 are in a non-conductive state, and NMOSTs QN1, QN2, QN3 are in a conductive state. Therefore the input switching level is shifted to the H side. Accordingly, if the input switching level of the input signal A is an intermediate potential, the output signal B to be delivered tends to be established at either the L or H side. In this embodiment, therefore, the current flowing in the circuits of FIG. 1C and FIG. 2C become smaller, and the input switching level is stabilized.

While the invention has been described in terms of an exemplary embodiment, it is contemplated that it may be practiced as outlined above with modifications within the spirit and scope of the appended claims.

What is claimed is:

1. A CMOS buffer circuit for reducing bounce noise, comprising;
   a first circuit composed of MOS transistors;
   a first resistance connected between a transistor of a certain conductive type of the first circuit and a first potential source; and
   a second resistance connected between a transistor of a reverse conductive type of the first circuit and a second potential source, wherein the resistance value of the first resistance is defined as R1, the resistance value of the second resistance is defined as R2, and the resistances are related by one of the equations $R1=\alpha R2$ and $R1=R2/\alpha$ where $\alpha$ is a constant.

2. A CMOS buffer circuit, comprising:
   a first circuit composed of MOS transistors;
   first resistor means connected between a transistor of a first conductivity type and a first potential source;
   second resistor means connected between a transistor of a first stage of the first circuit and the first potential source; and
   third resistor means connected between a transistor of a second conductivity type and a second potential source;
   wherein the current flowing in the first stage is smaller than the current flowing in the second circuit;
   and wherein said CMOS buffer circuit is not influenced by bounce noise.

3. The CMOS buffer circuit according to claim 2, wherein both the first resistor means and the second resistor means are parasitic resistances.

4. The CMOS buffer circuit according to claim 3, wherein the resistance value of said third resistor means is realized by varying the area of the wiring.

5. A CMOS buffer circuit, comprising:
   a first circuit composed of MOS transistors;
   first resistor means, wherein one end thereof is connected to a transistor of a first conductivity type of the first circuit;
   second resistor means connected between the other end of the first resistor means and a first potential source;
   third resistor means, wherein one end thereof is connected to a transistor of a second conductivity type; and
   fourth resistor means connected between the other end of the third resistor means and a second potential source wherein the sum of the resistance value of the first resistor means and the resistance value of the second resistor means is a constant multiple of the sum of the resistance value of the third resistor means and the resistance value of the fourth resistor means;
   wherein said CMOS buffer circuit is not influenced by bounce noise.

6. The CMOS buffer circuit of claim 5, wherein one of the first resistor means and the second resistor means is a parasitic resistance, and one of the third resistor means and the fourth resistor means is a parasitic resistance.

7. The CMOS buffer circuit of claim 6, wherein at least one of said third resistor and said fourth resistor is realized by varying the area of the wiring.

8. A CMOS buffer circuit, comprising:
   a first circuit composed of MOS transistors;
   first resistor means connected between a transistor of a first conductivity type of a second circuit of the first circuit and a first potential source;
   second resistor means connected between a transistor of a second conductivity type and a second potential source;
   third resistor means, wherein one end thereof is connected to a transistor of a certain conductive type of a first stage of the first circuit;
   fourth resistor means connected between the other end of the third resistor means and the first potential source;
   fifth resistor means, wherein one end thereof is connected to a transistor of the reverse conductive type of the first stage of the first circuit; and
   sixth resistor means connected between the other end of the fifth resistor means and the second potential source, wherein the current flowing in the first stage is smaller than the current flowing in the second circuit;
   wherein said CMOS buffer circuit is not influenced by bounce noise.

9. The CMOS buffer circuit of claim 8, wherein both the first resistor means and the second resistor means are parasitic resistances, one of the third resistor means and the fourth resistor means is a parasitic resistance, and one of the fifth resistor means and the sixth resistor means is a parasitic resistance.

10. The CMOS buffer circuit of claim 9, wherein at least one of said third resistor means, said fourth resistor means, said fifth resistor means and said sixth resistor means which is not a parasitic resistance is realized by varying the area of the wiring.

11. The CMOS buffer circuit according to any one of claims 1, 2, 5, and 8 wherein the first circuit is a circuit having a hysteresis characteristic and wherein one of the first resistor means and the second resistor means is a parasitic resistance.

12. The CMOS buffer circuit according to any one of claims 2, 5, and 8 wherein the first circuit is a circuit having a hysteresis characteristic and wherein both the first resistor means and the second resistor means are parasitic resistances.

13. The CMOS buffer circuit according to claim 5 wherein the first circuit is a circuit having a hysteresis characteristic and wherein one of the first resistor means and the second resistor means is a parasitic resistance, and one of the third resistor means and the fourth resistor means is a parasitic resistance.

14. The CMOS buffer circuit according to claim 8 wherein the first circuit is a circuit having a hysteresis factor and wherein both the first resistor means and the second resistor means are parasitic resistances, one of the third resistor means and the fourth resistor means is a parasitic resistance, and one of the fifth resistor means the sixth resistor means is a parasitic resistance.

15. The CMOS buffer circuit according to any one of claims 1, 2, 5, and 8, wherein the first circuit is a circuit having a hysteresis characteristic.

16. The CMOS buffer circuit according to any one of claims 1, 2, 5, and 8 wherein one of the first resistor means and the second resistor means is a parasitic resistance.

17. The CMOS buffer circuit according to claim 12, wherein at least one of said resistor means which is not a parasitic resistance is realized by varying the area of the wiring.

18. The CMOS buffer circuit of claim 13, wherein at least one of said resistor means which is not a parasitic resistance is realized by varying the area of the wiring.

19. The CMOS buffer circuit of claim 14, wherein at least one of said resistor means which is not a parasitic resistance is realized by varying the area of the wiring.

20. The CMOS buffer circuit of claim 16, wherein at least one of said resistor means which is not a parasitic resistance is realized by varying the area of the wiring.

* * * * *